United States Patent [19]
Chang et al.

[11] Patent Number: 5,359,558
[45] Date of Patent: Oct. 25, 1994

[54] FLASH EEPROM ARRAY WITH IMPROVED HIGH ENDURANCE

[75] Inventors: Chung K. Chang, Sunnyvale; Johnny C. Chen, Cupertino; Michael A. Van Buskirk, San Jose; Lee E. Cleveland, Santa Clara, all of Calif.

[73] Assignee: Advanced Micro Devices, Inc., Sunnyvale, Calif.

[21] Appl. No.: 109,886

[22] Filed: Aug. 23, 1993

[51] Int. Cl.[5] .................................... G11C 11/40
[52] U.S. Cl. .................. 365/189.07; 365/185; 365/189.09; 365/210; 365/218; 365/236; 365/900
[58] Field of Search ........... 365/185, 218, 900, 189.09, 365/189.07, 236, 210

[56] References Cited

U.S. PATENT DOCUMENTS

| | | | |
|---|---|---|---|
| 5,077,691 | 12/1991 | Haddad et al. | 365/218 |
| 5,138,580 | 8/1992 | Farrugia et al. | 365/185 |
| 5,233,562 | 8/1993 | Ong et al. | 365/218 |
| 5,237,535 | 8/1993 | Mielke et al. | 365/218 |
| 5,241,507 | 8/1993 | Fong | 365/185 |
| 5,268,870 | 12/1993 | Harari | 365/189.07 |
| 5,293,560 | 3/1994 | Harari | 365/189.07 |
| 5,297,096 | 3/1994 | Terada et al. | 365/189.07 |

Primary Examiner—Joseph E. Clawson, Jr.
Attorney, Agent, or Firm—Davis Chin

[57] ABSTRACT

An improved over-erased bit correction structure is provided for performing a correction operation on over-erased memory cells in an array of flash EEPROM memory cells after erase operation so as to render high endurance. Sensing circuitry (20) is used to detect column leakage current indicative of an over-erased bit during an APDE mode of operation and for generating a logic signal representative of data stored in the memory cell. A data input buffer circuit (26) is used to compare the logic signal and a data signal representative of data programmed in the memory cell so as to generate a bit match signal. A pulse counter (30) is coupled to the data input buffer circuit for counting a plurality of programming pulses applied thereto. The data input buffer circuit selectively connects only certain ones of the columns of bit lines to the pulse counter in which the bit match signal is at a high logic level so as to program back over-erased memory cells connected to only the certain ones of the columns of bit lines.

20 Claims, 5 Drawing Sheets

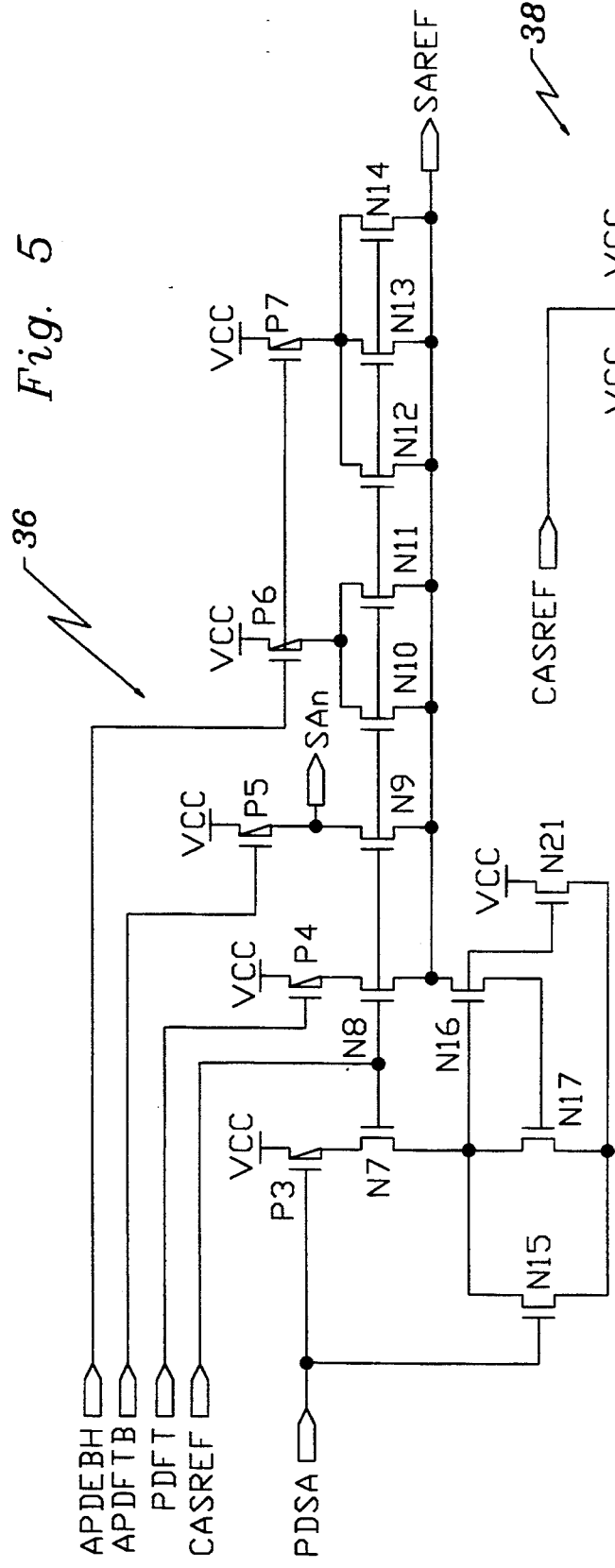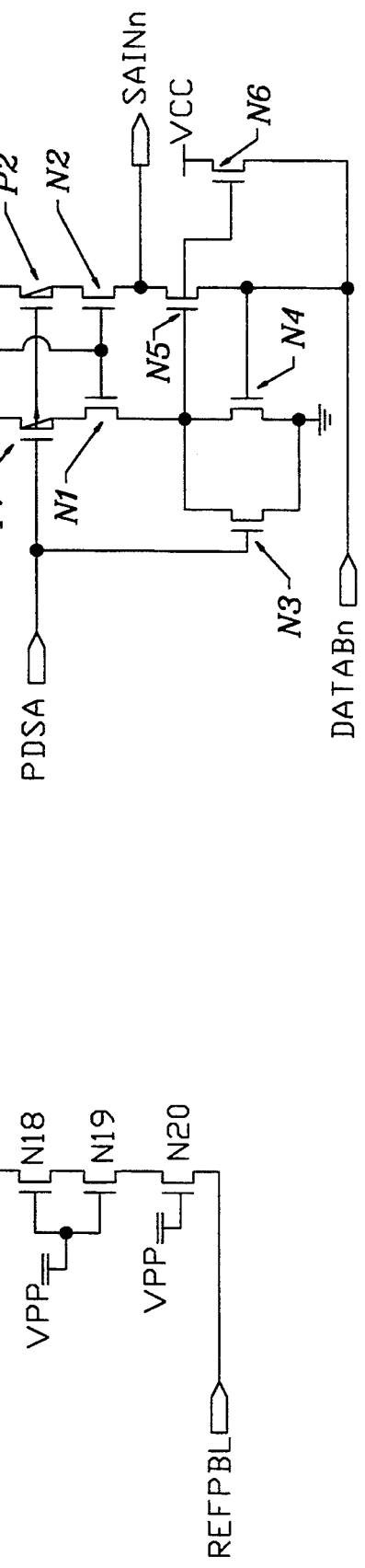

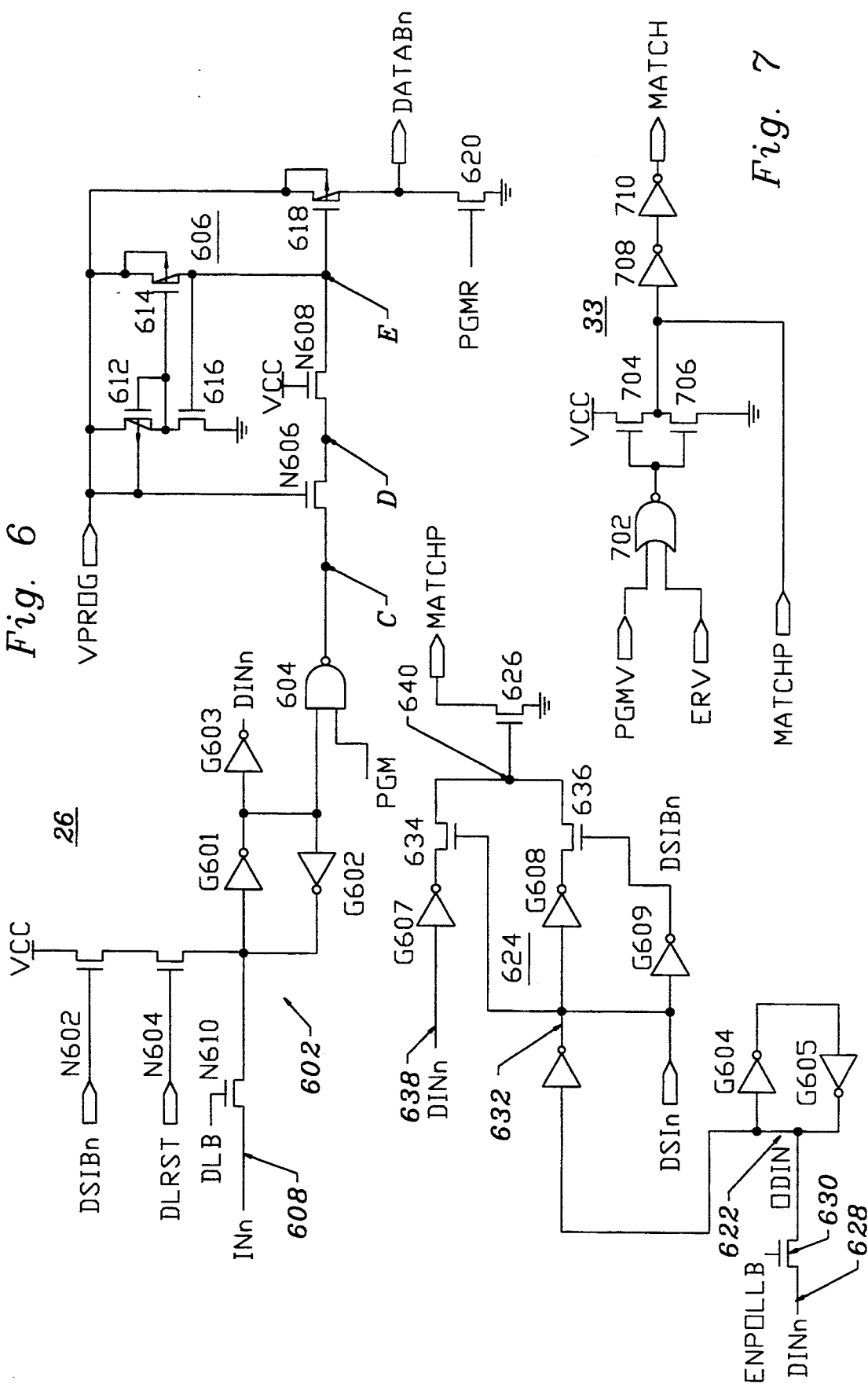

FLASH EEPROM ARRAY WITH IMPROVED HIGH ENDURANCE

BACKGROUND OF THE INVENTION

1. Field of the Invention

This invention relates generally to floating gate memory devices such as an array of flash electrically erasable programmable read-only memory (EEPROM) cells. More particularly, the present invention relates to a semiconductor integrated circuit memory device having an over-erased bit correction structure for performing a correction operation on over-erased memory cells in an array of flash EEPROM memory cells after erase operation so as to render improved high endurance.

2. Description of the Prior Art

As is generally known in the art, a new category of electrically erasable EPROMs/EEPROMs has emerged in recent years as an important non-volatile memory which combines the advantages of EPROM density with EEPROM electrical erasability and is sometimes referred to as "flash" EPROM or EEPROM. In these flash memories, a plurality of one-transistor flash EEPROM cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

In order to program the flash EEPROM cell in conventional operation, the drain region and the control gate are raised to predetermined potentials above the potential applied to the source region. For example, the drain region has applied thereto a voltage $V_D$ of approximately +5.5 volts with the control gate $V_G$ having a voltage of approximately +12 volts applied for approximately two or three microseconds. These voltages produce "hot electrons" which are accelerated across the thin dielectric layer and onto the floating gate. This hot electro injection results in an increase of the floating gate threshold by approximately two to four volts.

For erasing the flash EEPROM cell in conventional operation, a relatively high positive potential (i.e., +12 volts) is applied to the source region for a few tenths of a second. The control gate is grounded, and the drain region is allowed to float. A strong electric field develops between the floating gate and the source region, and negative charge is extracted from the floating gate to the source region by way of Fowler-Norheim tunneling. If an unprogrammed flash EEPROM cell in an array of such cells is repeatedly erased under these conditions, the floating gate will eventually acquire a more positive potential. Consequently, even with the control gate being grounded the cell will always be turned on which causes column leakage current thereby preventing the proper reading of any other cell in the column of the array containing this cell as well as making programming of the other cells on the same column increasingly more difficult. This condition is referred to as "bit over-erase" which is disadvantageous since the data programming characteristics of the memory cell is deteriorated so as to cause endurance failures.

An over-erased condition must be avoided in order to prevent the one-transistor flash EEPROM cell from being a depletion-like transistor in the read mode of operation. During this read mode of operation, an over-erased memory cell will disable a whole column of a memory array if these memory cells are structured as an array. As used herein, the term "endurance" refers to the number of times the memory cell may be re-programmed and erased. Consequently, the bit over-erased condition significantly reduces the endurance of the memory cell.

In order to determine whether the EEPROM cell has been properly programmed or not, the magnitude of the read current is measured. Typically, in the read mode of operation the source region is held at a ground potential (0 volts) and the control gate is held at a potential of about +5 volts. The drain region is held at a potential between 1 to 2 volts. Under these conditions, an unprogrammed cell (storing a logic "1") will conduct at a current level of approximately 50 to 100 uA. The programmed cell (storing a logic "0") will have considerably less current flowing.

There is described and illustrated in co-pending and commonly assigned Ser. No. 08/057,583 filed May 6, 1993, to M. A. Van Buskirk et al. and entitled "Flash EEPROM Array With High Endurance" an apparatus for correcting over-erased bits in an array of flash EEPROM memory cells so as to enhance its endurance. This correction of the over-erased bits occurred during the programming operation of a selected memory cell in the same column that contained the over-erased bits. The correction apparatus included a sensing circuit for detecting array column leakage indicative of an over-erased bit. When an over-erased bit was found to exist, a pulse generator would be activated so as to apply programming pulses to the control gate of the selected memory cell being programmed. Since the control gate of the non-selected memory cells in the same column containing the over-erased bit is provided with zero volts and the common source regions are tied to a ground potential, these programming pulses also serve to program back the negative threshold ($-V_t$) of the over-erased bits to a more positive threshold.

However, this correction technique has a number of drawbacks. First, this prior art correction operation results in the application of a high voltage (i.e., +10 to +12 volts) to a control gate and a moderate voltage (i.e., +5.5 to +6 volts) to the drains of the cell being programmed. This creates a drain stress and a gate stress as well as producing an undesirable high power dissipation. A second drawback arises from the fact that additional programming pulses are being applied also to the control gate of the cell being programmed during this correction operation. This has the undesirable effect of overprogramming the cell being programmed, thereby causing endurance problems. A third drawback is caused by the correction operation being performed on a byte-wise fashion. In other words, all of the bits in the whole byte receive indiscriminately the programming pulses regardless of whether it was needed or not. This long term programming tends to degrade the conductivity of the cell being programmed.

Accordingly, there has arisen a need to provide an apparatus for correcting over-erased bits in an array of flash EEPROM memory cells on a bit-wise fashion so that only the bits in a byte being programmed which require programming receive the programming pulses, thereby eliminating the undesirable effect of overprogramming. The present invention represents a significant improvement over the aforementioned Ser. No. 08/057,583, which is hereby incorporated by reference in its entirety.

SUMMARY OF THE INVENTION

Accordingly, it is a general object of the present invention to provide a semiconductor integrated circuit memory device having an improved over-erased bit correction structure for performing correction operation on over-erased memory cells in the memory device on an efficient and effective basis.

It is an object of the present invention to provide an over-erased bit correction structure for performing a correction operation on over-erased memory cells in an array of flash EEPROM memory cells after erase operation so as to render improved high endurance.

It is another object of the present invention to provide an over-erased bit correction structure which includes a pulse counter circuit for counting a plurality of generated programming pulses and a data input buffer circuit for selectively connecting only certain ones of columns of bit lines to receive the programing pulses so as to program back over-erased memory cells connected only to the certain ones of the columns of bit lines.

It is still another object of the present invention to provide an over-erased bit correction structure which includes sensing circuitry for generating a logic signal indicative of an over-erased memory cell and a data input buffer circuit for comparing a logic signal representative of data stored in the memory cell and a data signal representative of data being programmed in the memory cell so as to generate a bit match signal.

In accordance with these aims and objectives, the present invention is concerned with the provision of a semiconductor integrated circuit memory device having an improved over-erased bit correction structure for performing a correction operation on over-erased memory cells in the memory device. The correction structure includes a cell matrix having a plurality of memory cells arranged in rows of word lines and columns of bit lines intersecting rows of word lines. Each of the memory cells includes a floating gate array transistor. A row decoder is responsive to row address signals and is operatively connected to the cell matrix for selecting one of the rows of word lines. A column decoder is responsive to column address signals and is operatively connected to the cell matrix for selecting one of the columns of bit lines. A reference periphery bit line circuit is used for generating a reference current for the columns of bit lines.

The improved correction structure further includes a sensing circuit for comparing array leakage current in a selected one of columns of bit lines and the reference current associated with the selected one of the columns of bit lines during an APDE mode of operation and for generating a logic signal representative of data stored in the memory cell which is at a high logic level when the bit line leakage current is greater than the reference current indicative of an over-erased memory cell and which is at a low logic level when the bit line leakage current is less than the reference current indicative of a properly programmed memory cell. A data input buffer circuit compares the logic signal and a data signal representative of data programmed in the memory cell so as to generate a bit match signal which is at a high logic level when the logic signal and the data signal are equal. A pulse counter is coupled to the data input buffer circuit for counting a plurality of programming pulses applied thereto. The data input buffer circuit selectively connects only certain ones of the columns of bit lines to the pulse counter in which the bit match signal is at a high logic level so as to program back over-erased memory cells connected to only the certain ones of the columns of bit lines.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 4 is a schematic circuit diagram of the sense ratio resistive network of FIG. 2;

FIG. 5 is a schematic circuit diagram of the reference resistive network of FIG. 2;

FIG. 6 is a schematic circuit diagram of the data input buffer circuit of FIG. 2; and FIG. 7 is a schematic circuit diagram of the match circuit of FIG. 2.

DESCRIPTION OF THE PREFERRED EMBODIMENT

An improved over-erased bit correction structure for performing a correction operation on over-erased memory cells in an array of flash EEPROM memory cells fabricated on a silicon substrate is described. In the following description, numerous specific details are set forth, such as specific circuit configurations, components, and the like in order to provide a thorough understanding of the present invention. However, it should be apparent to those skilled in the art that the present invention may be practiced without these specific details. In other instances, well-known processes, circuits, and control lines, not particularly relevant to the understanding of the operating principles of the present invention, have been purposely omitted for the sake of clarity.

In order to fabricate flash memory devices of the EEPROM type with an improved high endurance, the present invention provides a new and novel over-erased bit correction structure for correcting over-erased bits in the array of flash EEPROM memory cells after erase operation. Unlike the correction technique used in Ser. No. 08/057,583, after the erase operation and prior to the programming mode of operation an "auto program disturb after erase" (APDE) mode of operation is performed. In the APDE mode, dummy data is loaded into the byte of the array to be programmed. Then, a program verify operation is performed in which the array column leakage current is compared to a reference current so as to detect a presence of over-erased bits as well as to determine which bits in the byte from the array needs to be programmed. This is done for each bit in the byte. This is achieved by a comparison between the data stored in the array and the data to be programmed.

If over-erased bits are determined to exist in certain ones of the columns of bit lines, during the APDE mode of operation a pulse counter is activated so as to count the programming pulses that are generated. However, the over-erased memory cells connected to only the certain ones of the columns of bit lines that need to be programmed will have their drains connected to receive the programming pulses. The memory cells connected to the columns of bit lines that do not require to be programmed have their drains disconnected from the programming pulses. In this manner, the problem of overprogramming of the memory cells to be programmed encountered heretofore has been eliminated. During this APDE mode, the over-erased memory cell connected to only the certain ones of the columns of bit lines will have the negative threshold voltage programmed back to a more positive voltage.

Figure 1:
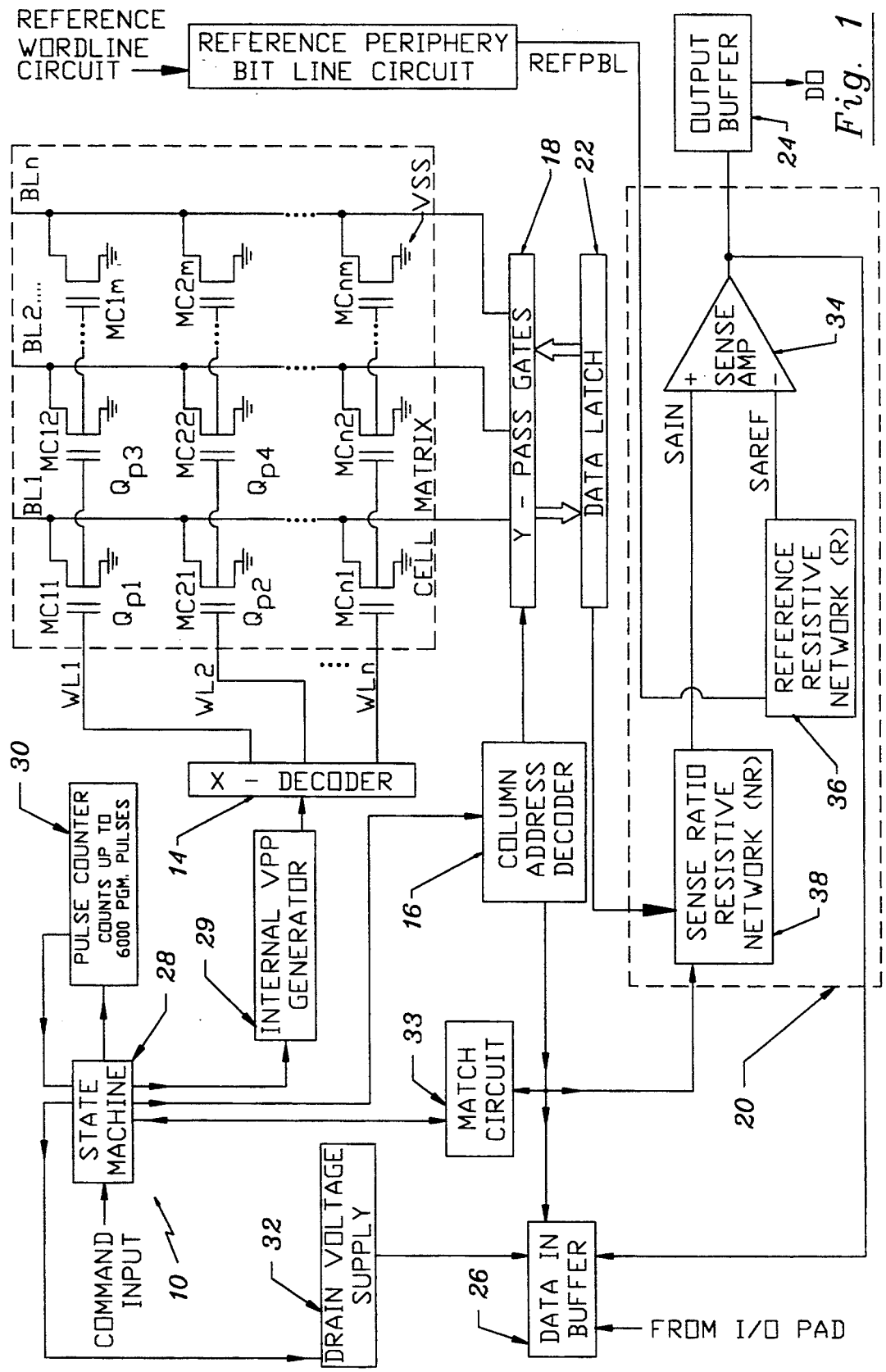
FIG. 1 is a block diagram of a semiconductor integrated circuit memory device having an improved over-erased bit correction structure, constructed in accordance with the principles of the present invention.

Referring now in detail to the drawings, there is shown in FIG. 1 a block diagram of a semiconductor integrated circuit memory device 10 which includes an improved over-erased bit correction structure of the present invention for performing a correction operation on over-erased memory cells in an array of flash electrically erasable read-only memory (EEPROM) cells of the memory device 10 after erasing so as to render a high endurance. The improved correction structure and the remaining portions of the memory device 10 are both wholly formed on a single semiconductor substrate by known CMOS integrated circuit technology.

The EEPROM semiconductor memory device 10 includes a cell matrix 12 formed of a plurality of memory cells MC11 through MCnm arranged on the semiconductor chip. The cell matrix is accessed by a row address decoder 14 responsive to row address signals for selecting one of the word lines $WL_1$ through $WL_n$. At the same time, the outputs of the column address decoder 16 responsive to column address signals is used to drive a Y-pass gate circuit 18 for selecting one of the bit lines $BL_1$ through $BL_n$. The data stored in the selected memory cell is read by sensing circuitry 20 via the Y-pass gate circuit 18 and a data latch 22. The output of the sensing circuitry 20 is used to drive an output buffer 24 for providing an output data DO. In a programming (write) mode, input data (i.e., data to be programmed) is supplied from an I/O pad to a data input buffer 26 and is then passed to the selected bit lines via the column address decoder 16 and the Y-pass gate circuit 18.

The overall control of the programming, reading, and erasing operations is achieved by a state machine 28. A pulse counter 30 is controlled by the state machine 28 which provides up to 6,000 programming pulses via a drain voltage supply 32 and the data input buffer 26 to only certain ones of the columns of bit lines. The drain voltage supply 32 is used to supply the data input buffer 26 with the proper voltage (i.e., +6 volts) during the APDE mode of operation. A sensing circuitry 20 is also controlled by the state machine 28 and includes means for detecting array column leakage current indicative of an over-erased bit connected to the particular column of bit lines.

Figure 2:
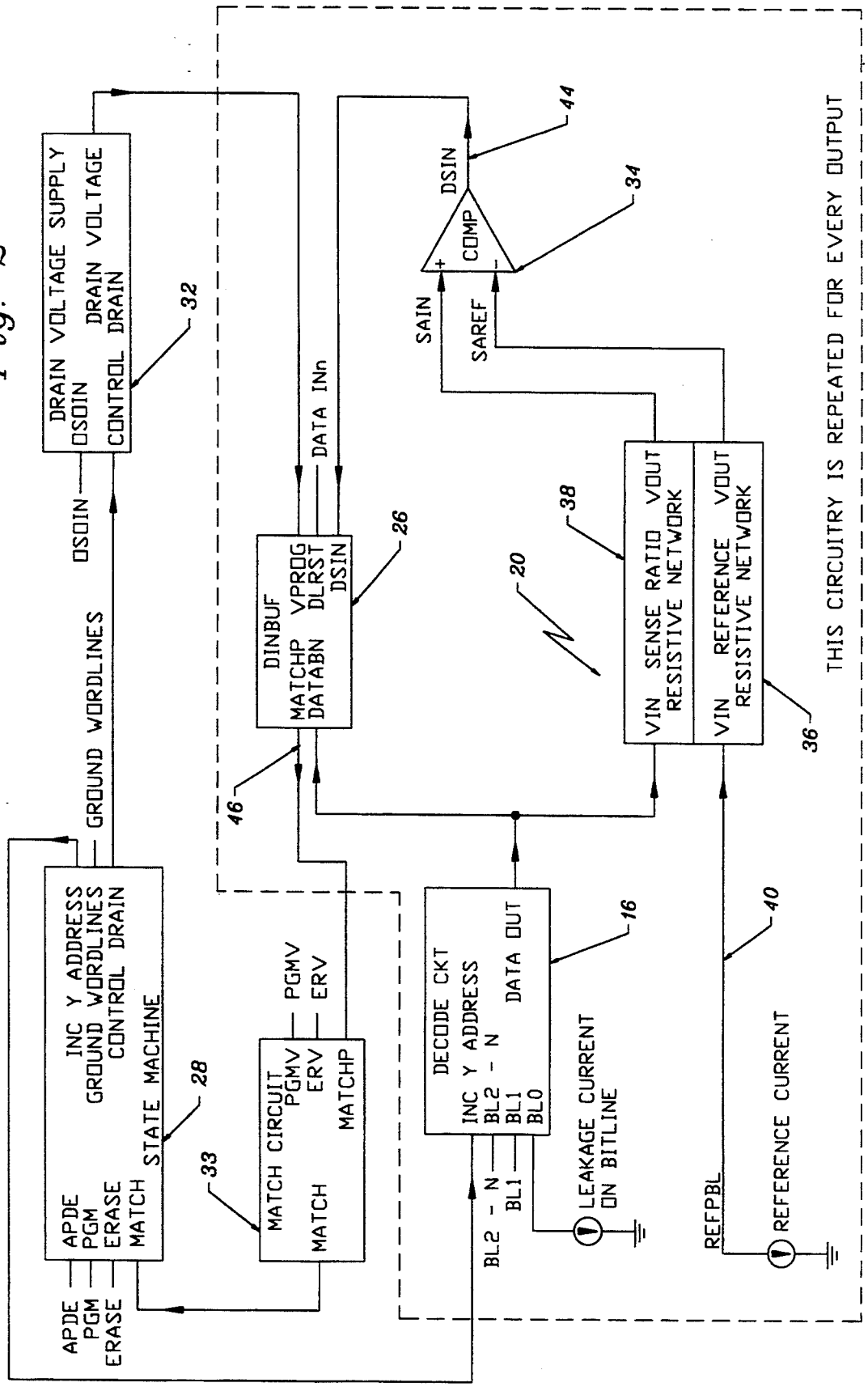
FIG. 2 is a simplified block diagram of the over-erased bit correction structure of FIG. 1.

The improved correction structure is essentially comprised of the sensing circuitry 20, a data input buffer 26, a match circuit 33, a pulse counter 30 and the drain voltage supply 32, all controlled by the state machine 28. In FIG. 2, there is illustrated a simplified diagram of the correction structure of FIG. 1. As can be seen, the sensing circuitry 20 is comprised of a comparator 34, a reference resistive network 36 having a resistance value of R, and a sense ratio resistive network 38 having a value of nR. The comparator is actually a sense amplifier. The reference resistive network 36 has its input connected to a reference periphery bit line REFPBL via line 40 and its output connected to the inverting input SAREF of the comparator 34. The reference current is generated by the reference periphery bit line circuit 42 (FIG. 1) and is divided down by the reference resistive network 36. The sense ratio resistive network 38 has its input connected to the output terminal DATABN of the data input buffer 26 and its output connected to the non-inverting input SAIN of the comparator 34. The sense ratio is defined by the number n, where n is equal to or greater than one, i.e., ranging between 1:1 to 6:1.

The output voltage VOUT on line 44 of the comparator 34 is fed to input terminal DSIN of the data input buffer 26. The data input buffer also receives the drain voltage VPROG from the drain voltage supply 33 and a data input signal DATA INn on its terminal DLRST. The input data buffer generates a first output signal on the terminal DATABN which is connected to the terminal DATA OUT of the decoder circuit 16 and a second output signal on the terminal MATCHP which is connected to the match circuit 33 via line 46. The decoder circuit 16 under the control of the state machine 28 will connect a particular column of the bit lines, which is to be measured for column leakage current, as addressed to its output terminal DATA OUT, which is then fed to the input of the sense ratio resistance network 38.

It will be noted that all of the circuit components within the dotted line is repeated for every output line. Typically, the array of memory cells would have eight (8) output lines. In particular, the array is divided into a plurality of sectors where each sector defines a predetermined number of rows within the flash EEPROM array. Further, each of the sectors is divided into a plurality of segments where each segment defines a predetermined number of columns. Thus, each of the eight output lines is generally associated with one of the plurality (8) of segments in each of the plurality of sectors.

Let us assume that the memory cells MC11 and MC12 (two bits of a byte) in the cell matrix 12 are to be programmed with data after a previous erase operation. Further, it will be assumed that the memory cell MC21 in the bit line $BL_1$ has been over-erased due to the previous erase operation and that no over-erased memory cells exist in the bit line $BL_2$. After erase and prior to a programming mode of operation, the "auto program disturb after erase" (APDE) mode of operation will be performed under the control of the state machine, which has a stored embedded algorithm, so as to correct the over-erased memory cells.

In particular, the state machine 28 will cause the word line $WL_1$ or control gates of the memory cells MC11 and MC12 via the X-decoder 14 to be grounded (0 volts). The state machine will then cause dummy programmed data (i.e., DATA INn =0) to be loaded into the memory cells MC11 and MC12. However, since the memory cell MC11 will have a negative threshold voltage (i.e., −3 volts) due to an over-erased condition, there will be column leakage current in the bit line $BL_1$. Next, the state machine will cause a program verify mode of operation to be performed in which the sensing circuitry 20 will effectively compare the column leakage current in the bit line BL1 to the reference current in the reference peripheral line REFPPL of the reference periphery line circuit 42.

Accordingly, during this program verify operation the column leakage current in the bit line BL1 will be greater than the reference current divided by the sense ratio indicating an over-erased bit and the output on line 44 of the comparator will be at a high or "1" logic level. This means that the memory cell MC11 has not yet been program verified. The data input buffer is responsive to the high logic level and will cause the input terminal VPROG to be connected to the output terminal or data bit line DATABN. Further, the bit match signal on the terminal MATCHP1 will be at a low logic level since the dummy programmed data (DATA IN =0) will not be equal to the data stored in the array (DSIN =1).

Next, the state machine will cause the program verify operation to be repeated on the bit line BL2 in which the sensing circuitry 20 compares the column leakage current in the bit line BL2 with the reference current divided by the sense ratio in the reference periphery bit line REFPBL. Since we assumed that no column leakage current existed in any of the memory cells connected to the bit line BL2, the output on line 44 of the comparator will be at a low or "0" logic level indicating that the memory cell MC12 has already been programmed. The data input buffer is responsive to the low logic level and will cause the input terminal VPROG to be disconnected from the data bit line DATABN. The bit match signal on the terminal MATCHP2 will be at a high logic level since the programmed data (DATA IN =0) will be equal to the data stored in the array (DSIN =0).

This program verify operation will be repeated for each bit in the byte being programmed. Thus, it will be noted that this program verify operation is performed on a bit-wise fashion. A byte match signal MATCH from the match circuit 33 will only be "high" if there is a complete match for each of the bits in the byte. In the present case, since the bit match signal MATCHP1 is at a low logic level, this will cause the byte match signal MATCH to also be at a low logic level. The state machine will be responsive to this low logic level of the byte match signal so as to cause a first programming pulse from the pulse generator 30 to be fed to the input of the drain voltage supply 32. The output of the drain voltage supply will be at +6 volts which is fed to the terminal VPROG in each of the data input buffer 26. However, only those bits in the byte from the array that need to be programmed back will have the drain voltage supply connected to the corresponding data bit line DATABN.

Now another program verify operation will be done again in the bit lines that did not match previously. If there is still not a match, then the state machine will cause a second programming pulse to be sent to the corresponding data bit line DATABN. Then, still another program verify operation will be performed. This process is repeated over and over up to 6,000 programming pulses allowed by the pulse counter 30.

Each time a programming pulse is applied to the bit line containing over-erased bits (the only bits that need to be programmed back, i.e., memory cell MC21) their threshold voltage will be programmed back toward a positive threshold voltage $+V_t$. Therefore, by continually applying program pulses one-at-a-time (up to 6,000 pulses), the over-erased bits (MC21) will be corrected so that there will be no more leakage current in the corresponding bit line BL1. Typically, the number of programming pulses needed to program back an over-erased bit is 250.

In other words, after a predetermined number of programming pulses, the column leakage current in the columns having the over-erased cell will eventually be less than the reference current and the corresponding output of the comparator will be at a low or "0" logic level indicating that the memory cell (i.e., MC11) has been programmed. The associated data input buffer will respond to this low logic level so as to disconnect the terminal VPROG from the data bit line DATABN. It should be understood that this programming back will continue if there are other bit lines having a column leakage current. Only after each and everyone of the over-erased bits in the byte has been corrected will the byte match signal MATCH be changed to a high logic level. At this time, the state machine 28 will be responsive to the high logic level and terminate the programming pulses from being applied to the drain voltage supply 32.

Accordingly, it can be seen that this programming back is done on a byte-wise fashion. Once a particular byte is completed, the state machine will cause the decoder to access a new address for the next byte to be programmed back. Only after all of the bytes in the sector have completed APDE mode, the state machine then allows the programming mode to be performed. Unlike Ser. No. 08/057,583, the programming back of the over-erased bits in the present invention is done after erase and before the programming mode and is not done during programming. As a result, the programming mode of operation in the present invention is much faster since all of the over-erased bits will have already been corrected during the APDE mode.

While the various blocks 42, 38, 36, 26 and 33 in FIGS. 1 and 2 may take on various forms, suitable circuitry therefor are illustrated in respective FIGS. 3 through 7. Even though these schematic circuit diagrams are believed to be self-explanatory to those skilled in the art in view of the foregoing description, a brief description of operation of each is believed to be in order.

Figure 3:
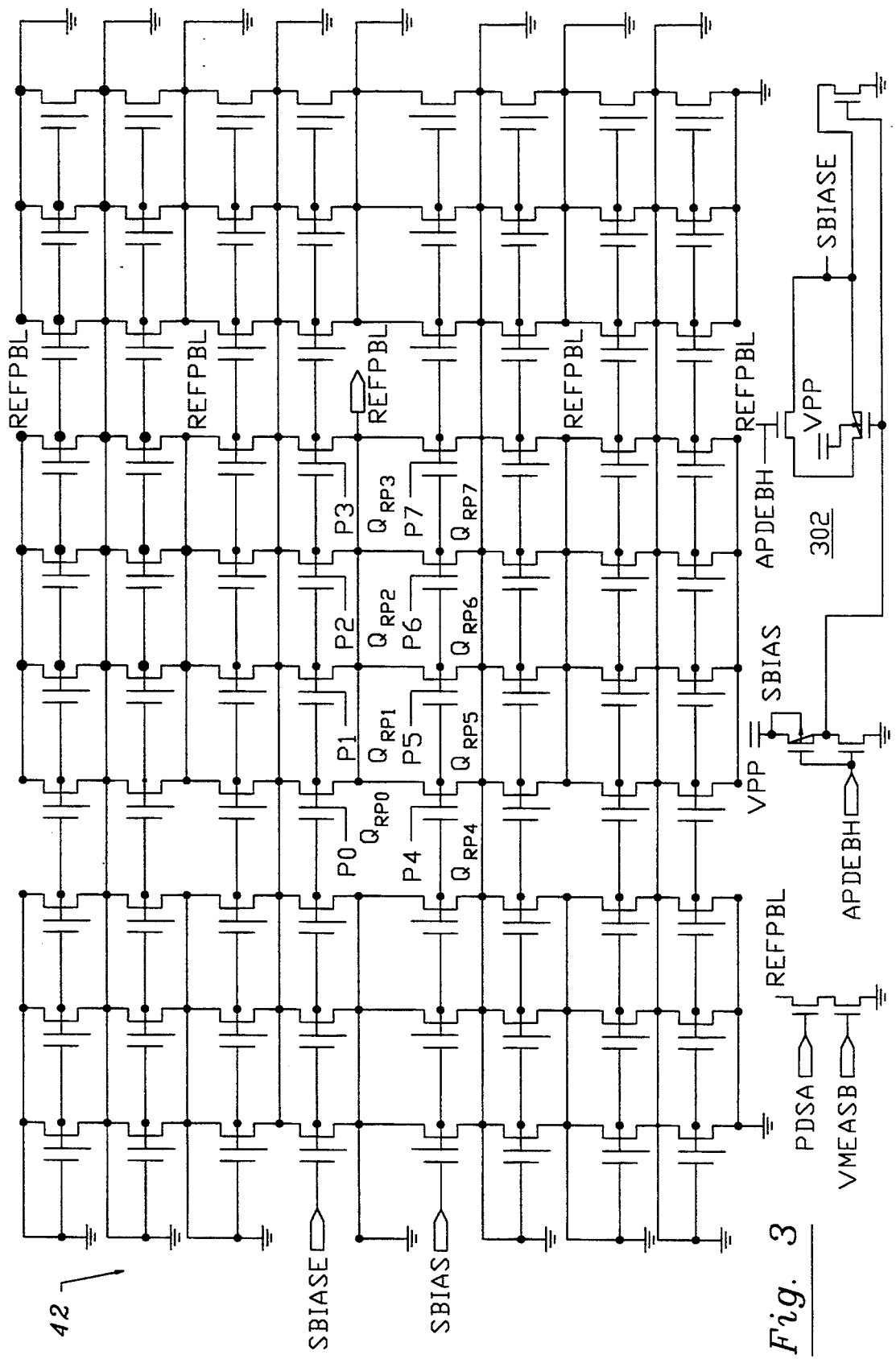
FIG. 3 is a detailed schematic circuit diagram of the reference periphery bit line circuit of FIG. 1.

In FIG. 3, there is shown a schematic circuit diagram of the reference periphery line circuit 42 of FIG. 1. The reference periphery bit line circuit is a mini-array for the reference resistive networks 36 so as to supply the corresponding reference currents thereto. The reference periphery circuit is comprised of eight bit reference cell transistors $Q_{RP0}$ through $Q_{RP7}$, one transistor for each of the corresponding eight reference resistive networks. The other remaining transistors in the reference array define additional friendly rows and friendly columns which are used to compensate for the different currents found between the center bit transistors and edge bit transistors. The auto program disturb circuit 302 is used during the APDE mode of operation so as to double the sense ratio. In other words, the sense ratio of 6:1 was increased to 12:1. By having a higher sense ratio, a higher gate voltage could be supplied. As a result, there is created a smaller variation in the column leakage currents.

In FIG. 4, there is illustrated a schematic circuit diagram of the sense ratio resistance network 38 having a value of nR. The sense ratio resistance network 38 is comprised of P-channel MOS transistors P1, P2 and N-channel MOS transistors N1–N6. The resistance value of the network 38 is determined by the transistor N2 whose source is connected to the non-inverting input SAIN of the comparator 34. The gate of the transistor N2 receives a reference voltage CASREF, which is less than the supply voltage VCC, which is typically +5.0 volts ±10%. The gates of the transistors P1 and P2 are connected to the power down signal PDSA, which is used to turn off the same during the power down mode in order to reduce power consumption. The node DATABN corresponds to the input of the network 38 and is connected to the common drains of the floating gate array transistors which are tied to the same bit line. The transistors N3–N6 are used for level shifting so as to maintain the node DATABN at a predetermined value during the various modes of operation.

In FIG. 5, there is depicted a schematic circuit diagram of the reference resistive network 36. The reference resistive network is comprised of P-channel MOS transistors P3–P7 and N-channel MOS transistors N7–N21. A resistance value of the network 36 in FIG. 5 is determined by the transistors N8–N14. The size of each of the transistors N8–N14 is preferably made to be equal to the size of the transistor N2 in the sense ratio resistive network 38 in FIG. 4. It will be noted that the node REFPBL corresponds to the input of the reference resistive network 36 and is connected via the divider circuit 40 to the reference periphery bit line circuit 42 which supplies the reference current. The gates of the transistors N7 and N8 are connected to the reference voltage CASREF, and the gates of the transistors P3 and N15 are connected to the power down signal PDSA. The gate of the transistor P4 is connected to a power down floor test signal PDFT, and the gate of the transistor P5 is connected to an auto program disturb floor test signal APDFTB. The gates of the transistors P6 and P7 are connected to an auto program disturb after erase signal APDEBH. During the APDE mode of operation, the network 36 of FIG. 5 will cause the resistance at the inverting input SAREF of the comparator 34 to yield a total sense ratio n ($R_{38}/R_{36}$) of approximately 12:1. The network 36 of FIG. 5 provides a 6:1 sense ratio, and the auto program disturb circuit 302 causes a doubling of the sense ratio.

A schematic circuit diagram of the data input buffer circuit 26 is illustrated in FIG. 6. A data input buffer circuit 26 operates to supply the drain voltage VPROG to the drain regions of the over-erased memory cells of only the certain ones of the columns of bit lines having a column leakage current through the data bit line DATABn during the APDE. The buffer circuit 26 disconnects the drain voltage VPROG from the data bit line coupled to the drain regions of memory cells which do not require to be programmed back. The buffer circuit includes two N-channel control transistors N602 and N604; a DINn latch circuit 602; a NAND logic gate 604; two N-channel pass transistors N606 and N608; and a level-shifting circuit 606. The data input signal INn is applied to line 608 which is connected to the input of the latch circuit 602. The DINn latch circuit is comprised of an N-channel pass transistor 610 and inverter gates G601–G603. When the clock signal DLB on the gate of the transistor N610 is at a high logic level, a data input signal INn will be passed through to the node DINn. When the clock signal is low, the data is latched on the node DINn. The level-shifting circuit 606 is formed of P-channel transistors 612, 614, and an N-channel transistor 616. The buffer circuit also includes a P-channel pull-up transistor 618 for selectively connecting the drain voltage DPROG to the corresponding data bit line DATABn and an N-channel discharge transistor 620 for discharging the data bit lines DATABn during the program reset mode.

Further, a buffer circuit 26 is comprised of an ODIN latch circuit 622, a comparator circuit 624, and a comparator transistor 626. The node DINn is applied to line 628 which is connected to the input of the ODIN latch 622. The ODIN latch circuit is formed of an N-channel pass transistor 630 and inverter gates G604–G606. When the enable polling signal ENPOLLB is high on the gate of the transistor 630, the data signal on the line 628 will pass through to the node 632. When the signal ENPOLLB is low, data is latched on the node 632. The comparator circuit 624 consists of inverters G607–G609 and N-channel pass transistors 634, 636. The data signal on the node DINn is also connected to the line 638 which is the input of the inverter G607. The signal DSINn, which is the output of the comparator 34 representing the data stored in the array, is fed to the gate of the transistor 634 and to the input of the inverter G609. The source of the transistors 634 and 636 are tied together and to the gate of the comparator transistor 626. The output of the inverter G609 on node DSIBn is connected to the gate of the pass transistor 636 and to the gate of the control transistor N602.

During the APDE mode, the dummy programmed data (INn=0) is initially loaded into the DINb latch circuit 602 by making the signal DLB go high. Then, the signal DLB will go low so as to hold the data to be programmed for the current PGM pulse in the DINn latch 602. Then the signal ENPOLLB goes low, and the output of the ODIN latch 622 on the node 632 will hold the data to be programmed. Next, a program verify operation will be performed so as to determine which bits in the byte of the array need to be programmed back.

If the data stored in the array is already programmed (DSIn=0), the node DSIBn will be high which turns on the transistor N602. When the delay reset signal DLRST goes high and the program signal PGM goes high, this causes the output of the NAND gate 604 to go high. This high is in turn passed through the pass transistors N606 and N608 as applied to the gate of the pull up transistor 618, thereby turning off the same. As a result, the terminal VPROG connected to the drain voltage supply will not be connected to the data bit line DATABn, thereby preventing subsequent PGM pulses from applying additional drain programming voltage to the drain regions of the memory cells. Further, it will be noted that the comparator circuit 624 will cause the node 640 to be low since the nodes 632 and DSIBn will both be high. Consequently, the transistor 626 will be turned off and the associated bit match signal MATCHP will be high.

On the other hand, if the data stored in the array is not already programmed (DSIn=1, indicating the existence of an over-erased memory cell), the node DSIBn will be low which keeps the transistor 602 turned off. Thus, when the signal DLRST goes high and the program signal PGM goes high, the DINn latch 602 will not reset and the output of the NAND gate 604 will remain low. This low is now passed through the transistors N606 and N608 and is applied to the gate of the pull-up transistor 618, thereby turning on the same. Therefore, the drain voltage supply on the terminal VPROG will be connected to the data bit line DATABn, which is connected to the drain regions of the memory cells. In this manner, only the bits in the byte that need to be programmed back receive the PGM pulse. This eliminates the undesired effect of over-programming. Further, the comparator circuit 624 will cause the node 640 to be high since DINn=0 and DSIn=1. Consequently, the transistor 626 will be turned on and the associated bit match signal MATCHP will be low.

Each of the bit match signals (MATCHP1-MATCHP8) from the corresponding 8 data input buffers on the chip is connected to the match circuit 33 which performs a "wired NORed" function on the eight bit match signals MATCHP1-MATCH8 in order to provide the byte match signal MATCH. The byte match signal MATCH will go high only if all of the bit match signals MATCHP1-MATCHP8 are high. When the byte match signal goes high, this indicates that all of the over-erased memory cells in each bit of the byte in the array have been corrected and the programming pulses are to be terminated. In other words, the byte data stored in the array matches the byte data to be programmed. The state machine 28 is responsive to the byte match signal MATCH going high and will cause the decoder circuit 16 to access the next address containing the next byte to be programmed back. A schematic circuit diagram of the match circuit 33 in FIG. 2 is depicted in FIG. 7. A match circuit is comprised of a NOR gate 702, P-channel transistor 704, an N-channel transistor 706, and inverter gates 708, 710. The terminal MATCHP receives each of the bit match signals (MATCHP1-MATCHP8) from the corresponding data input buffers.

It should be apparent to those skilled in the art that this improved over-erased bit correction structure of the present invention is also applicable to negative gate voltage erase. In particular, in order to erase the flash EEPROM cell with the negative gate voltage operation a relatively high negative potential (i.e., −10 volts) is applied to the control gate, +5 volts being applied to the source region and the drain region being allowed to float.

From the foregoing detailed description, it can thus be seen that the present invention provides improved over-erased bit correction circuit for performing a correction operation on over-erased memory cells in an array of flash EEPROM memory cells after erase so as to render high endurance. The improved over-erased bit correction structure includes sensing circuitry for detecting column leakage current indicative of an over-erased bit during an APDE mode of operation and generates a logic signal representative of data stored in the memory cell. A data input buffer circuit compares the logic signal and a data signal representative of data to be programmed in the memory cell so as to generate a bit match signal. A pulse counter is coupled to the data input buffer for providing a plurality of programming pulses thereto. The data input buffer circuit selectively connects only certain ones of the columns of bit lines to the pulse counter in which the bit match signal is at a high logic level so as to program back over-erased memory cells connected to only the certain ones of the columns of bit lines.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In a semiconductor integrated circuit memory device having an over-erased bit correction structure for performing a correction operation on over-erased memory cells in the memory device, said correction structure comprising, in combination:

a cell matrix (12) having a plurality of memory cells arrayed in rows of word lines and columns of bit lines intersecting said rows of word lines, each of said memory cells including a floating gate array transistor having its gate connected to one of said rows of word lines, its drain connected to one of said columns of bit lines, and its source connected to a ground potential;

row decoder means (14) responsive to row address signals and being operatively connected to said cell matrix for selecting one of said rows of word lines;

column decoder means (16) responsive to column address signals and being operatively connected to said cell matrix for selecting one of said columns of bit lines;

reference periphery bit line circuit means (42) for generating a reference current for said columns of bit lines;

sensing circuit means (20) for comparing leakage current in a selected one of said columns of bit lines and the reference current associated with the selected one of said columns of bit lines during an APDE mode of operation and for generating a logic signal representative of data stored in the memory cell, said logic signal being at a high logic level when said bit line leakage current is greater than said reference current indicative of an over-erased memory cell and being at a low logic level when said bit line leakage current is less than said reference current indicative of a properly programmed memory cell;

data input buffer circuit means (26) for comparing said logic signal and a data signal representative of data programmed in the memory cell so as to generate a bit match signal which is at a high logic level when said logic signal and said data signal are equal;

pulse counter means (30) coupled to said data input buffer circuit means for counting a plurality of programming pulses applied thereto; and said data input circuit means selectively connecting only certain ones of said columns of bit lines to said pulse counter means in which said bit match signal is at the high logic level so as to program back over-erased memory cells connected to only the certain ones of said columns of bit lines.

2. In a semiconductor integrated circuit memory device as claimed in claim 1, wherein said plurality of programming pulses serve to change the negative threshold of the array transistor in the over-erased memory cell to a positive threshold voltage.

3. In a semiconductor integrated circuit memory device as claimed in claim 1, wherein said sensing circuit means is comprised of sense ratio resistive network (38) operatively connected to said columns of bit lines for generating a first resistance value corresponding to the leakage current in the selected one of said columns of bit lines, reference resistive network means (36) operatively connected to said reference periphery bit line circuit means for generating a second resistance value corresponding to the reference current, and comparator means (34) having a first input coupled to a sense ratio resistive network means and a second input connected to said reference resistive network means for comparing the column leakage current and the reference current.

4. In a semiconductor integrated circuit memory device as claimed in claim 3, wherein the ratio of said first resistance value to said second resistance value is defined to be a sense ratio which is increased to approximately 12:1 during the APDE mode of operation so as to enhance the endurance of the memory device.

5. In a semiconductor integrated circuit memory device as claimed in claim 1, wherein said reference periphery bit line circuit means is comprised of a mini-array for generating a corresponding reference current for each output line.

6. In a semiconductor integrated circuit memory device as claimed in claim 5, wherein said reference periphery bit line circuit means includes means (302) for doubling the sense ratio of said sensing circuit means.

7. In a semiconductor integrated circuit memory device as claimed in claim 1, further comprising match circuit means (33) responsive to the bit match signal from eight data input buffer means for generating a byte match signal which is at a high logic level only when each match signal is high.

8. In a semiconductor integrated circuit memory device as claimed in claim 7, wherein said pulse counter means terminates said plurality of pulses only when the byte match signal is at a high logic level indicating that a complete match exists between the byte data from the array and the byte data to be programmed.

9. In a semiconductor integrated circuit memory device as claimed in claim 8, further including means (28) responsive to said byte match circuit for selecting the next byte in the array to be programmed.

10. In a semiconductor integrated circuit memory device having an over-erased bit correction structure for performing a correction operation on over-erased memory cells in the memory device, said correction structure comprising, in combination:

a cell matrix (12) having a plurality of memory cells arrayed in rows of word lines and columns of bit lines intersecting said rows of word lines, each of said memory cells including a floating gate array transistor having its gate connected to one of said rows of word lines, its drain connected to one of said columns of bit lines, and its source connected to a ground potential;

row decoder means (14) responsive to row address signals and being operatively connected to said cell matrix for selecting one of said rows of word lines;

column decoder means (16) responsive to column address signals and being operatively connected to said cell matrix for selecting one of said columns of bit lines;

reference periphery bit line circuit means (44) for generating multiple reference currents each associated with one of the said columns of bit lines;

sensing circuit means (20) for comparing leakage current in a selected one of said columns of bit lines and the reference current associated with the selected one of said columns of bit lines during an APDE mode of operation and for generating a logic signal representative of data stored in the memory cell, said logic signal being at a high logic level when said bit line leakage current is greater than said reference current indicative of an over-erased memory cell and being at a low logic level when said bit line leakage current is less than said reference current indicative of a properly programmed memory cell;

data input buffer circuit means (26) for comparing said logic signal and a data signal representative of data programmed in the memory cell so as to generate a bit match signal which is at a high logic level when said logic signal and said data signal are equal;

pulse counter means (30) coupled to said data input buffer circuit means for counting a plurality of programming pulses applied thereto; and said data input circuit means selectively connecting only certain ones of said columns of bit lines to said pulse counter means in which said bit match signal is at the high logic level so as to program back over-erased memory cells connected to only the certain ones of said columns of bit lines.

11. In a semiconductor integrated circuit memory device as claimed in claim 10, wherein said plurality of programming pulses serve to change the negative threshold of the array transistor in the over-erased memory cell to a positive threshold voltage.

12. In a semiconductor integrated circuit memory device as claimed in claim 10, wherein said sensing circuit means is comprised of sense ratio resistive network (38) operatively connected to said columns of bit lines for generating a first resistance value corresponding to the leakage current in the selected one of said columns of bit lines, reference resistive network means (36) operatively connected to said reference periphery bit line circuit means for generating a second resistance value corresponding to the reference current, and comparator means (34) having a first input coupled to a sense ratio resistive network means and a second input connected to said reference resistive network means for comparing the column leakage current and the reference current.

13. In a semiconductor integrated circuit memory device as claimed in claim 12, wherein the ratio of said first resistance value to said second resistance value is defined to be a sense ratio which is increased to approximately 12:1 during the APDE mode of operation so as to enhance the endurance of the memory device.

14. In a semiconductor integrated circuit memory device as claimed in claim 10, wherein said reference periphery bit line circuit means is comprised of a mini-array for generating the multiple reference currents for each output line.

15. In a semiconductor integrated circuit memory device as claimed in claim 14, wherein said reference periphery bit line circuit means includes means (302) for doubling the sense ratio of said sensing bit means.

16. In a semiconductor integrated circuit memory device as claimed in claim 10, further comprising match circuit means (33) responsive to the bit match signal from eight data input buffer means for generating a byte match signal which is at a high logic level only when each match signal is high.

17. In a semiconductor integrated circuit memory device as claimed in claim 16, wherein said pulse counter means terminates said plurality of pulses only when the byte match signal is at a high logic level indicating that a complete match exists between the byte data from the array and the byte data to be programmed.

18. In a semiconductor integrated circuit memory device as claimed in claim 17, further including means (28) responsive to said byte match circuit for selecting the next byte in the array to be programmed.

19. An over-erased bit correction for correcting over-erased memory cells in an array of flash EEPROM memory cells after erase operation so as to render high endurance, said correction structure comprising:

sensing circuit means (20) for comparing leakage current in a selected one of columns of bit lines and a reference current associated with the selected one of said columns of bit lines during an APDE mode of operation and for generating a logic signal representative of data stored in the memory cell, said logic signal being at a high logic level when said bit line leakage current is greater than said reference current indicative of an over-erased memory cell and being at a low logic level when said bit line leakage current is less than said reference current indicative of a properly programmed memory cell;

data input buffer circuit means (26) for comparing said logic signal and a data signal representative of data programmed in the memory cell so as to generate a bit match signal which is at a high logic level when said logic signal and said data signal are equal;

pulse counter means (30) coupled to said data input buffer circuit means for counting a plurality of programming pulses applied thereto; and said data input circuit means selectively connecting only certain ones of said columns of bit lines to said pulse counter means in which said bit match signal is at the high logic level so as to program back over-erased memory cells connected to only the certain ones of said columns of bit lines.

20. In a semiconductor integrated circuit memory device as claimed in claim 19, wherein said plurality of programming pulses serve to change the negative threshold of the array transistor in the over-erased memory cell to a positive threshold voltage.

* * * * *